US010143082B2

(12) United States Patent
Gao et al.

(10) Patent No.: US 10,143,082 B2
(45) Date of Patent: Nov. 27, 2018

(54) REFLECTION SHEET AND METHOD OF MANUFACTURING THE SAME

(71) Applicant: 3M INNOVATIVE PROPERTIES COMPANY, St. Paul, MN (US)

(72) Inventors: Jian Xia Gao, Singapore (SG); Ravi Palaniswamy, Singapore (SG); Muthu Sebastian, Singapore (SG); Dominic M. Travasso, Singapore (SG); Augusto A. Noronha, III, Austin, TX (US); Woo-Young Ahn, Gyeonggi-do (KR); Moses M. David, Woodbury, MN (US); Nathan P. Kreutter, Austin, TX (US); Kihoon Sung, Suwon (KR)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 15/327,397

(22) PCT Filed: Aug. 5, 2015

(86) PCT No.: PCT/US2015/043715
§ 371 (c)(1),
(2) Date: Jan. 19, 2017

(87) PCT Pub. No.: WO2016/022628
PCT Pub. Date: Feb. 11, 2016

(65) Prior Publication Data
US 2017/0164462 A1 Jun. 8, 2017

Related U.S. Application Data

(60) Provisional application No. 62/034,382, filed on Aug. 7, 2014.

(51) Int. Cl.
*H05K 1/03* (2006.01)
*H05K 3/02* (2006.01)
(Continued)

(52) U.S. Cl.
CPC ............ *H05K 1/03* (2013.01); *C23C 14/022* (2013.01); *C23C 14/025* (2013.01);
(Continued)

(58) Field of Classification Search
CPC ...... H05K 1/03; H05K 1/0306; H05K 1/0313; H05K 1/032; H05K 3/02; H05K 3/10
See application file for complete search history.

(56) References Cited

U.S. PATENT DOCUMENTS 5,620,767 A 4/1997 Harigaya
2002/0150772 A1 10/2002 Nakai
(Continued)

FOREIGN PATENT DOCUMENTS

JP 61-25128 2/1986
KR 10-2007-0103141 10/2007
(Continued)

OTHER PUBLICATIONS

International Search Report for PCT International Application No. PCT/US2015/043715, dated Oct. 9, 2015, 4 pages.

*Primary Examiner* — Jeremy C Norris
(74) *Attorney, Agent, or Firm* — Robert S. Moshrefzadeh

(57) ABSTRACT

A reflection sheet and a method of manufacturing a reflection sheet are disclosed. The reflection sheet comprises a substrate layer and a reflective layer formed on the substrate layer, wherein the reflective layer comprises an alloy consisting of silver (Ag), palladium (Pd) and neodymium (Nd).

19 Claims, 8 Drawing Sheets

(51) Int. Cl.
*H05K 3/10* (2006.01)
*C23C 14/02* (2006.01)
*C23C 14/20* (2006.01)
*C23C 28/02* (2006.01)
*C23C 14/34* (2006.01)
*H05K 1/02* (2006.01)

(52) U.S. Cl.
CPC ............ *C23C 14/205* (2013.01); *C23C 14/34* (2013.01); *C23C 28/021* (2013.01); *H05K 1/028* (2013.01); *H05K 3/02* (2013.01)

(56) References Cited

U.S. PATENT DOCUMENTS

| | | |
|---|---|---|
| 2005/0008883 A1 | 1/2005 | Takagi |
| 2006/0131700 A1 | 6/2006 | David |
| 2009/0130365 A1* | 5/2009 | Kojima .............. G11B 7/24038 428/64.4 |
| 2014/0369884 A1 | 12/2014 | Tauchi |

FOREIGN PATENT DOCUMENTS

| | | | |
|---|---|---|---|
| WO | WO 2013-115002 | 8/2013 | |
| WO | WO 2014-168712 | 10/2014 | |
| WO | WO 2014168712 A1 * | 10/2014 | ............. G06F 3/041 |

* cited by examiner

REFLECTION SHEET AND METHOD OF MANUFACTURING THE SAME

FIELD OF INVENTION

The present invention relates broadly to a reflection sheet and a method of manufacturing the same.

BACKGROUND

A light emitting diode (LED) is an electronically-packaged diode that emits light. LEDs are typically placed on a flexible circuit (also known as flex circuit), a printed circuit board (PCB) or a ceramic board. The amount of light that is generated is a function of the technology used, the size of the chip and the current applied. Light is generally emitted off the top or side of the electronic package. Light that is not reflected to a desired target is wasted energy. Managing the light effectively can reduce the energy required and reduce the overall heat in the system. Reflectivity is critical to get the most lumens (a measure of brightness) out of a LED by utilizing all available light. In the current LED industry, the surface reflectivity of LED circuit should be at least 70%. For example, typical white solder masks can provide a specular reflectivity of around 85%.

A challenge in the LED industry is to devise a visually appealing device such as a display sign or electronics display gadgets that are aesthetically appealing and have an enhanced brightness performance in a cost-effective manner.

In one existing approach, a paint layer or an organic material coating is used to achieve reflection in lighting applications. However, the reflectivity of these paint layers is usually not uniform due to the heterogeneous nature of the material, and corrosion and deterioration of the material in the course of time.

In another existing approach, aluminium or silver coatings are used as reflection sheets, and the reflection layer is protected by transparent polymer film. However, these coatings may be easily corroded by atmospheric moisture.

A need therefore exists to provide a reflection sheet that seeks to address at least some of the above problems, or provide a useful alternative.

SUMMARY

According to an aspect of the present invention, there is provided a reflection sheet comprising
a substrate layer; and
a reflective layer formed on the substrate layer,
wherein the reflective layer comprises an alloy consisting of silver (Ag), palladium (Pd) and neodymium (Nd).

A weight percent of Ag in the alloy may be in the range of 98-99%, the weight percent of Pd may be in the range of 0.5-1.5%, and the weight percent of Nd may be in the range of 0.1-1.0%, the sum of the weight percents making 100%.

The ratio of the weight percent of Ag:Pd:Nd in the alloy may be 98.7:1:0.3.

The substrate layer may comprise a material selected from a group consisting of polyimide, polyester (PET), epoxy, liquid crystal polymer (LCP) and thermoplastic polymer.

The reflection sheet may further comprise at least one intermediate layer disposed between the substrate layer and the reflective layer.

The substrate layer may comprise polyimide, and the at least one intermediate layer may comprise a copper (Cu) layer.

The at least one intermediate layer may further comprise a diffusion barrier layer between the copper layer and the reflective layer, the diffusion barrier layer comprising an alloy consisting of nickel (Ni), chromium (Cr) and titanium (Ti).

The at least one intermediate layer may further comprise a tie layer between the polyimide substrate layer and the copper layer, the tie layer comprising at least one material selected from a group consisting of nickel-chromium (NiCr), chromium oxide (CrO$_x$), silver (Ag) and molybdenum silver (MoAg).

The substrate layer may comprise PET, and the at least one intermediate layer may comprise a tie layer comprising at least one material selected from a group consisting of copper (Cu), molybdenum (Mo), silver (Ag), molybdenum silver (MoAg), nickel chromium (NiCr), chromium oxide (CrO$_x$), nickel chromium oxide (NiCrO$_x$), titanium (Ti) and titanium oxide (TiO).

The at least one intermediate layer may further comprise an indium-tin-oxide (ITO) layer between the PET substrate layer and the tie layer.

The ITO layer may comprise a surface treated with a tetramethylsilane/O$_2$ (TMS/O$_2$) plasma for enhancing adhesion.

According to another aspect of the present invention, there is provided a method of manufacturing a reflection sheet, the method comprising the steps of:
providing a substrate layer; and
depositing a reflective layer on the substrate layer,
wherein the reflective layer comprises an alloy consisting of silver (Ag), palladium (Pd) and neodymium (Nd).

A weight percent of Ag in the alloy may be in the range of 98-99%, the weight percent of Pd may be in the range of 0.5-1.5%, and the weight percent of Nd may be in the range of 0.1-1.0%, the sum of the weight percents making 100%.

The ratio of the weight percent of Ag:Pd:Nd in the alloy may be 98.7:1:0.3.

The substrate layer may comprise a material selected from a group consisting of polyimide, polyester (PET), epoxy, liquid crystal polymer (LCP) and thermoplastic polymer.

The method may further comprise depositing at least one intermediate layer on the substrate layer prior to depositing the reflective layer.

The substrate layer may comprise polyimide, and depositing at least one intermediate layer may comprise depositing a copper (Cu) layer on the substrate layer using electric deposition technique.

Depositing at least one intermediate layer may further comprise depositing a diffusion barrier layer on the copper layer prior to depositing the reflective layer, the diffusion barrier layer comprising an alloy consisting of nickel (Ni), chromium (Cr) and titanium (Ti).

Depositing at least one intermediate layer may further comprise depositing a tie layer on the polyimide substrate layer prior to depositing the copper layer, the tie layer comprising at least one material selected from a group consisting of nickel-chromium (NiCr), chromium oxide (CrO$_x$), silver (Ag) and molybdenum silver (MoAg).

The substrate layer may comprise PET, and depositing at least one intermediate layer may comprise depositing a tie layer comprising at least one material selected from a group consisting of copper (Cu), molybdenum (Mo), silver (Ag), molybdenum silver (MoAg), nickel chromium (NiCr), chromium oxide (CrO$_x$), nickel chromium oxide (NiCrO$_x$), titanium (Ti) and titanium oxide (TiO).

Depositing at least one intermediate layer may further comprise depositing an indium-tin-oxide (ITO) layer on the PET substrate layer prior to depositing the tie layer.

The method may further comprise treating a surface of the ITO layer with a tetramethylsilane/O$_2$ (TMS/O$_2$) plasma for enhancing adhesion.

According to another aspect of the present invention, there is provided a flexible circuit comprising the reflection sheet as described herein.

BRIEF DESCRIPTION OF THE DRAWINGS

Embodiments of the invention will be better understood and readily apparent to one of ordinary skill in the art from the following written description, by way of example only, and in conjunction with the drawings, in which:

FIG. 2b shows schematic diagram illustrating a film stack using the reflection sheet of FIG. 2a.

DETAILED DESCRIPTION

Figure 1A:
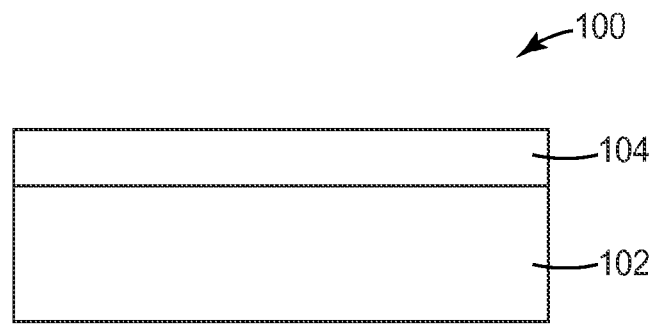
FIG. 1a shows a schematic diagram illustrating a cross-sectional view of a reflection sheet according to an example embodiment.

The example embodiments provide a reflection sheet which is suitable for use in lighting applications, e.g. in LED circuits. In a basic form, the reflection sheet includes a substrate or base layer and a reflective layer made of an alloy of silver (Ag), palladium (Pd) and Neodymium (Nd) formed or attached onto the substrate layer. The alloy is interchangeably referred to in the drawings and in the following description as APD. Typically, the weight percent (which is indicative of the composition by weight) of Ag in the alloy is about 98-99%, the weight percent of Pd is about 0.5-1.5%, and the weight percent of Nd is about 0.1-1.0%. The relative compositional amounts may be adjusted accordingly to make up 100%. In preferred embodiments, the ratio of the weight percent of Ag:Pd:Nd in the alloy is 98.7:1:0.3.

As discussed in further detail in the following description, the reflection sheet may include at least one intermediate layer between the substrate layer and the reflective layer. For example, the intermediate layer(s) can enhance the adhesion between the substrate layer and the reflective layer, act as a barrier layer, or provide a desired property in the end-application. The number of intermediate layers and their respective materials may be selected based on factors such as the material of the substrate layer and the end-application utilizing the reflection sheet.

Figure 1B:
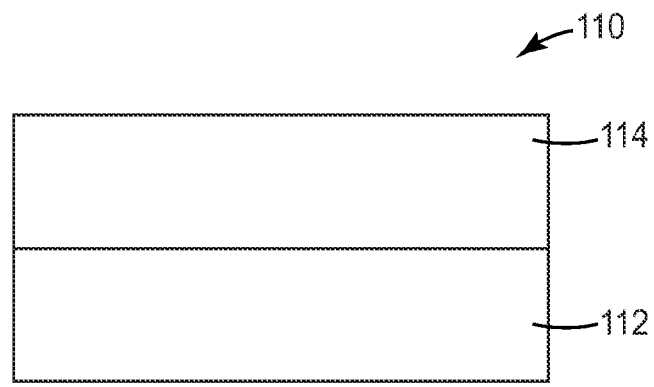
FIG. 1b shows a schematic diagram illustrating a cross-sectional view of a reflection sheet according to another example embodiment.

FIGS. 1a and 1b show schematic diagrams illustrating cross-sectional views of reflection sheets 100 and 110 respectively in the basic form according to example embodiments. In FIG. 1a, the reflection sheet 100 includes a polyester (PET) substrate layer 102 and a reflective layer (denoted as APD) 104 formed on the PET substrate layer 102. In FIG. 1b, the reflection sheet 110 includes a polyimide substrate layer 112 and a reflective layer (denoted as APD) 114 formed on the polyimide substrate layer 112.

Figure 1C:
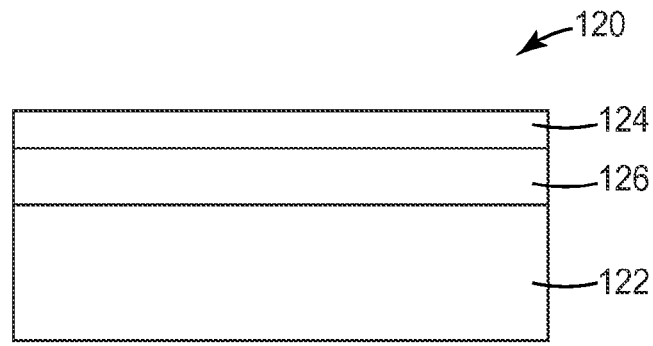
FIG. 1c shows a schematic diagram illustrating a cross-sectional view of a reflection sheet according to another example embodiment.
Figure 1D:
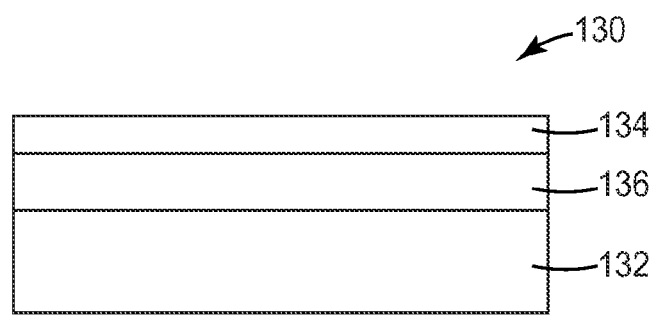
FIG. 1d shows a schematic diagram illustrating a cross-sectional view of a reflection sheet according to another example embodiment.
Figure 1E:
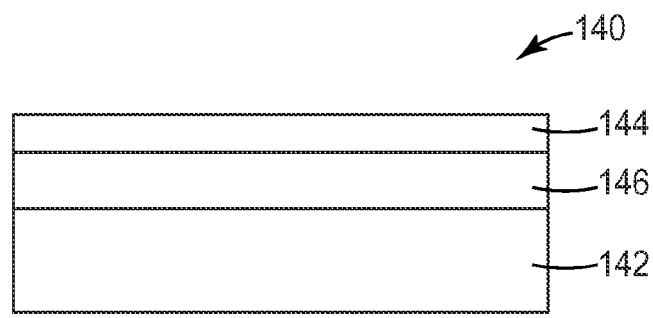
FIG. 1e shows a schematic diagram illustrating a cross-sectional view of a reflection sheet according to another example embodiment.

FIGS. 1c-1e show schematic diagrams illustrating cross-sectional views of reflection sheets 120, 130 and 140 respectively in alternate forms according to example embodiments. In FIG. 1c, the reflection sheet 120 includes a PET substrate layer 122, a reflective layer 124 and a copper (Cu) intermediate layer 126 therebetween. In FIG. 1d, the reflection sheet 130 includes a substrate layer in the form of a polymeric film 132, a reflective layer 134 and a molybdenum (Mo) or molybdenum silver (MoAg) intermediate layer 136 therebetween. In FIG. 1e, the reflection sheet 140 includes a polyimide substrate layer 142, a reflective layer 144 and a copper (Cu) intermediate layer 146 therebetween.

It will be appreciated that FIGS. 1a-1e are provided as examples only, and the reflection sheet according to embodiments of the invention can have different combinations of the substrate or base layer, intermediate layer(s) and the reflective layer.

For example, with reference to FIG. 1d, in certain cases, Mo and Ag are used as an intermediate seed layer 136 with a ratio of about 60%/40% to improve the adhesion of the APD reflective layer 134 to the polymeric substrate layer 132. Alloy construction and ratios of Mo and Ag can be varied to increase adhesion properties, and some examples of variations of alloy construction are shown in Table 1.

TABLE 1

|  | Layer 1 | Layer 2 | Layer 3 |
| --- | --- | --- | --- |
| Example 1 | Mo | Mo/Ag | Ag/Pd/Nd |
| Example 2 | Mo | Ag/Pd/Nd | |
| Example 3 | Mo/Ag | Ag/Pd/Nd | |
| Example 4 | Ag/Pd/Nd | | |

The reflection sheets as described above can be used in e.g. lighting circuit applications. For example, the Ag/Pd/Nd alloy can be patterned (e.g. etched) using a photolithographic process such as wet chemical etching to make a circuit for mounting LED lights. In some cases, the APD is sputtered on a thick copper layer and both are etched simultaneously using cupric chloride etchant to make circuits. Table 2 shows an example formulation for simultaneous etching.

TABLE 2

| Etchant formulation to etch APD, Mo—Ag alloys and copper simultaneously | |
|---|---|
| Cupric ion | 100-180 g/l |
| HCl | 0.04-1N |
| Oxidant | Sodium chlorate or Hydrogen peroxide as a replenisher |
| Temperature | 50-60 C. |
| Redox potential | 600 mv |

As shown in FIGS. 1a-1e, the material used for the substrate layer 102, 112, 122, 132, 142 is either PET or polyimide. However, it will be appreciated that the substrate layer can be made of other suitable polymeric materials in alternate embodiments. Preferably, the material for the substrate layer is transparent and may include, but is not limited to, polyimide, PET, epoxy, liquid crystal polymer (LCP), or thermoplastic polymer. In some embodiments where the reflection sheet is used in flex circuits, the material for the substrate layer is flexible or bendable. Also, in alternate embodiments, multiple intermediate layers may be used.

Figure 2A:
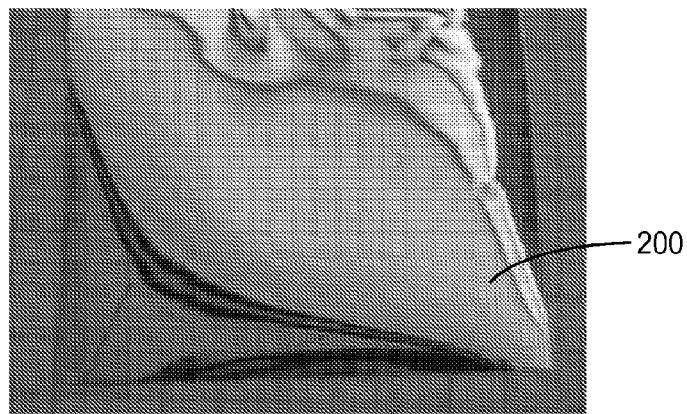
FIG. 2a shows an image illustrating a sample reflection sheet according to an example embodiment.

FIG. 2a shows an image illustrating a sample reflection sheet 200 according to an example embodiment in which APD is coated on polyimide, similar to that shown in FIG. 1b. As discussed above, the composition of APD includes Ag (98-99%), Pd (0.5-1.5%) and Nd (0.1-1.0%), with the relative amounts being adjustable to make up 100%. Preferably, the composition is Ag (98.7%), Pd (1%) and Nd (0.3%). The APD reflective layer can be deposited several hundred to several thousand angstroms thick onto the polyimide substrate, which may have a thickness from ½ millimeters (mm) to 3 mm. For applications that require high-temperature resistance, or manufacturing methods that involve high-temperature processing (e.g. in excess of 300° C.), other high-temperature substrates such as epoxy, polyimide, or liquid crystal polymer (LCP) can be used instead of polyimide. As can be seen from FIG. 2a, the surface of the reflection sheet 200 is highly polished and reflective, making it suitable for lighting applications.

Figure 2B:
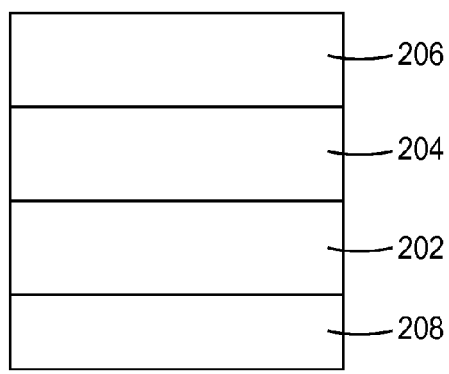
Figure 2C:
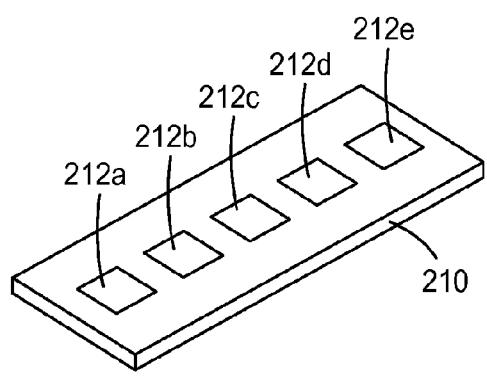
FIG. 2c a schematic diagram illustrating sample sheets which have been cut and placed at regular intervals.

Referring to FIG. 2b, typically, the APD and polyimide combination (e.g. the reflection sheet 200 shown in FIG. 2a) can be sent to a convertor where an adhesive 202, which may be thermal plastic, high temperature, thermally conductive, thermal set, pre-preg or bond ply, can be applied on the side of the substrate layer 204 opposite to the APD reflective layer 206 for attaching with a liner 208. The finished reflective film with the liner 208 and adhesive 202 can be punch stamped, rotary die cut for placement e.g. over a LED. FIG. 2c shows a schematic diagram illustrating an example reflection sheet 210 which has been punched at regular intervals, forming holes 212a-e that can be used e.g. to receive LED. Other end-applications are possible.

Figure 3:
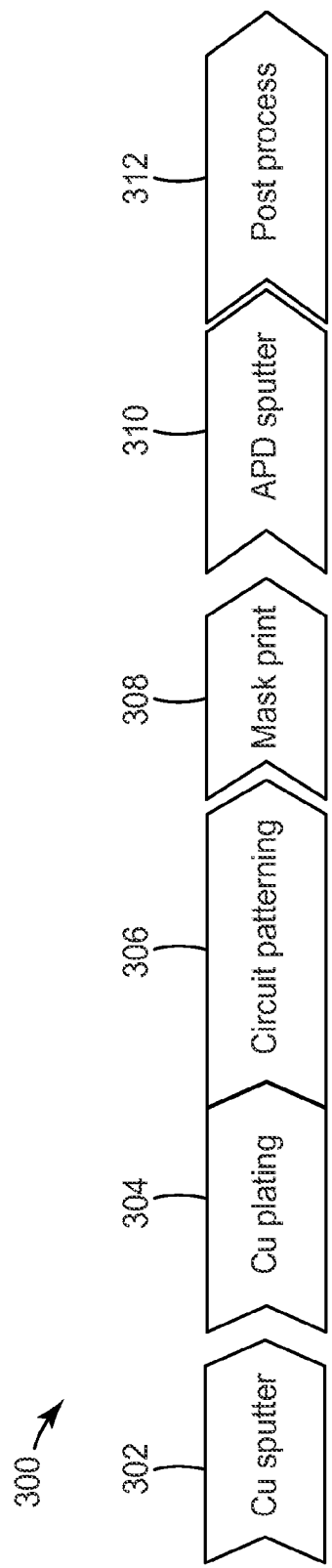
FIG. 3 shows a flow chart illustrating a method of manufacturing a reflection sheet according to an example embodiment that utilises electric deposition.

FIG. 3 shows a flow chart 300 illustrating a method for manufacturing a reflection sheet, such as the reflection sheet 140 shown in FIG. 1e, according to an example embodiment that utilises electric deposition. At step 302, an intermediate layer in the form of a copper (Cu) seed layer is coated on a polyimide (PI) substrate using a roll-to-roll sputter machine, e.g. by loading one roll of the PI substrate in the sputter machine and performing the sputtering process. At step 304, a Cu plating is performed on the sputtered Cu in order to make a smooth Cu layer with a thickness of about 2 micrometers (μm) to 12 μm. For example, surface activation is carried out using a chemical wet roller which is mounted on topside of the plating bath. The plating chemical composition may include $H_2SO_4$ (16.31%)+$CuSO_{4.5}H_2O$ (2.2%)+HCl (0.01%)+Brightner (0.05%)+Leveler (1.36%)+Water (80.07%). Other parameters may include a plating electric current of about 2.0 Amp/dm2, plating time of about 15 minutes in bath, web speed of about 0.4 M/min, and tension of about 3 to 4 kgf/500 mm. Such parameters may provide surface uniformity (very small grain size), a high validity width of 490 mm of 514 mm (i.e. efficiency is more than 95%), low tension and dimension stability. In an alternate embodiment, the Cu layer may be roll annealed onto the PI substrate layer.

After completing the Cu plating process, at step 306, a circuit patterning process which includes photo-resist lamination, UV exposure, photo-resist development, Cu etching, etc., is performed. This step can be applied to the Cu deposited by either electric deposition or roll annealing as discussed above. At step 308, as mask is printed on the electric deposited or roll annealed Cu so that the APD reflective layer can be sputtered on the selected area.

After the mask is printed, the structure obtained from step 308 is cleaned, e.g. unwinded from a roll and then provided into an ion gun treatment zone with a speed of about 0.6 meter/minute. For example, in order to generate a plasma in this zone, argon (Ar) and oxygen ($O_2$) are added at a gas flow ratio of Ar:$O_2$=40 sccm:10 sccm, which may mean a gas pressure of about about 3 mTorr in this zone. The voltage of the ion gun is about 700V such that the plasma can be generated in this zone by the ion gun to clean the Cu surface.

After completing the ion gun treatment, at step 310, an APD sputter process follows. As discussed, the ratio of the weight percent in the APD target is Ag:Pd:Nd=98.7:1:0.3, the power which is applied on the target is 3.0 kilowatts (kW), while the gas flow is 100 standard cubic centimeters per minute (sccm). The deposited APD thickness is about 100 nm in this process. At step 312, post processing is carried out to remove the mask from the Cu surface, and to clean and dry the final circuit's surface.

Figure 4:
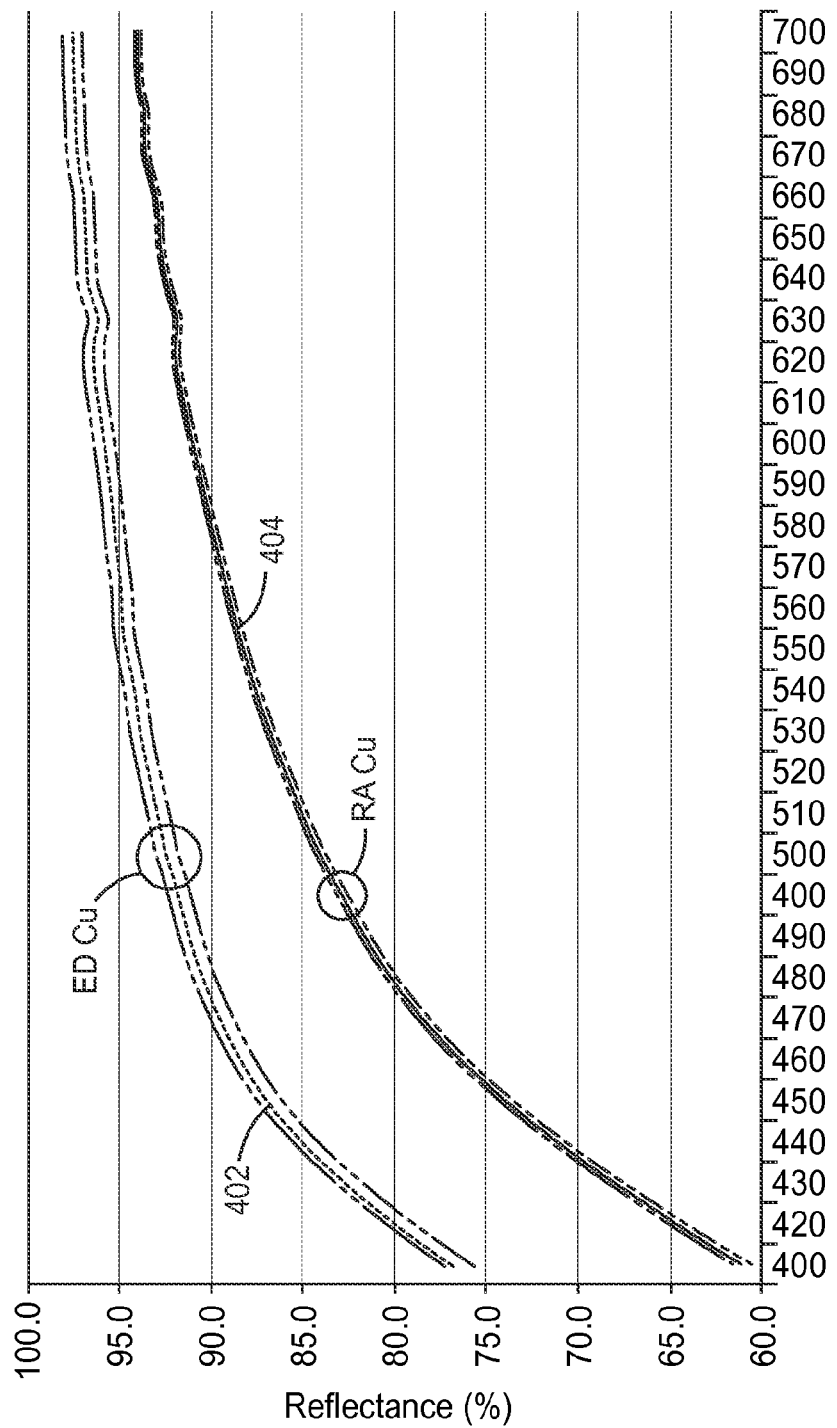
FIG. 4 shows graphs illustrating optical reflectance of the structure obtained from the method of FIG. 3.

FIG. 4 shows graphs illustrating optical reflectance of the APD/Cu/PI structure obtained from the method as described above with respect to FIG. 3. As can be seen in FIG. 4, the APD on the electric deposited (ED) Cu (lines 402) shows a very high reflectance which can be beyond 95% if the wavelength is longer than 550 nm. The APD on the roll annealed (RA) Cu (lines 404) shows a slightly lower reflectance of about 88%, which may be sufficient for most applications.

Tables 3 and 4 show the roughness of the Cu surface and the APD surface. For Table 3, the Cu layer is formed by ED, and APD is sputter deposited thereon. For Table 4, the Cu layer is formed by RA and APD is sputter deposited thereon. The Cu surface roughness (Rmax along X-direction) in Table 3 is in the range of 0.1 to 0.3 μm, while it is in the range of 1.3 to 1.8 μm in Table 4. Similarly, after APD is sputter deposited on the Cu layer formed by ED, the APD surface roughness (Rmax along X-direction) is in a range of 0.1 to 0.3 μm (see Table 3), which indicates that the surface is relatively very smooth. For the APD sputter deposited on the Cu layer formed by RA, the APD surface roughness (Rmax along X-direction) is in a range of 1.2 to 1.7 μm (see Table 4).

TABLE 3

|  |  | APD | | | Cu | | |
|---|---|---|---|---|---|---|---|
| X-direction | Ra (μm) | 0.01 | 0.01 | 0.01 | 0.01 | 0.02 | 0.01 |
| | Rz (μm) | 0.06 | 0.10 | 0.07 | 0.10 | 0.15 | 0.10 |
| | Rmax (μm) | 0.09 | 0.29 | 0.09 | 0.12 | 0.30 | 0.13 |
| Y-direction | Ra (μm) | 0.01 | 0.01 | 0.01 | 0.01 | 0.01 | 0.01 |
| | Rz (um) | 0.05 | 0.04 | 0.06 | 0.09 | 0.09 | 0.09 |
| | Rmax (um) | 0.06 | 0.05 | 0.08 | 0.11 | 0.13 | 0.12 |

\* APD on ED Copper \*

TABLE 4

|  |  | APD | | | Cu | | |
|---|---|---|---|---|---|---|---|
| X-direction | Ra (μm) | 0.23 | 0.21 | 0.23 | 0.24 | 0.24 | 0.26 |
| | Rz (μm) | 1.34 | 1.17 | 1.45 | 1.30 | 1.47 | 1.55 |
| | Rmax (μm) | 1.65 | 1.23 | 1.69 | 1.37 | 1.65 | 1.76 |
| Y-direction | Ra (μm) | 0.12 | 0.14 | 0.13 | 0.16 | 0.15 | 0.16 |
| | Rz (μm) | 0.70 | 0.84 | 0.78 | 0.89 | 0.87 | 0.83 |
| | Rmax (μm) | 0.73 | 1.00 | 0.88 | 1.07 | 0.01 | 0.97 |

\* APD on RA Copper \*

Figure 5:
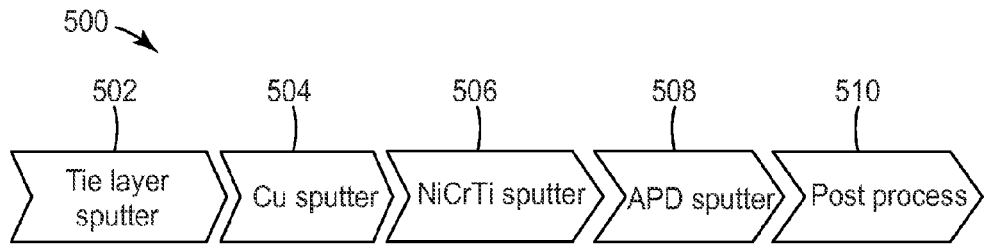
FIG. 5 shows a flow chart illustrating a method of manufacturing a reflection sheet according to another embodiment that utilises a diffusion barrier layer.

FIG. 5 shows a flow chart 500 illustrating a method of manufacturing a reflection sheet according to another embodiment. Here, the material for the substrate layer is polyimide (PI), similar to that in the method described with respect to FIG. 3. At step 502, a tie layer is deposited (e.g. sputtered) onto the PI surface to improve adhesion. The tie layer may also help to reduce or minimise atom/ion migration. The material of the tie layer can be, for example, nickel chromium (NiCr), chromium oxide ($CrO_x$), silver (Ag), or molybdenum silver (MoAg). At step 504, a copper (Cu) layer is deposited on the tie layer, e.g. by sputtering in a manner similar to that described above with respect to FIG. 3. At step 506, a barrier layer is deposited (e.g. sputtered) onto the Cu layer. In this example, the barrier layer is an alloy of nickel (Ni), chromium (Cr) and titanium (Ti), and the composition of the NiCrTi alloy can be Ni:Cr:Ti=78%: 20%:2% or Ni:Cr:Ti=72%:20%:8%. At step 508, the APD reflective layer is sputtered onto the barrier layer formed in step 506. At step 510, post processing is performed after completing the APD deposition, to create patterns on the APD/NiCrTi/Cu/Tie/PI structure and to obtain a highly reflective flex circuit. Such a circuit can be used in display panels, for example. Here, the tie layer, Cu layer and NiCrTi diffusion barrier layer can be considered as intermediate layers.

The NiCrTi barrier layer deposited between the APD reflective layer and the Cu layer in the example embodiment can provide an effective diffusion barrier to reduce or minimise atoms/ions diffusion between APD and Cu layers, and at the same time, increase adhesion between the APD and Cu layers. Moreover, the ratio of Ni:Cr:Ti can be adjusted/controlled precisely according to practical requirements, e.g. such that the NiCrTi layer can be etched easily for making flex circuit in the post-processing step. It will be appreciated that, in alternate embodiments, other materials, such as silver (Ag), molybdenum silver (MoAg) can be used as the diffusion barrier layer instead of NiCrTi.

Figure 6:
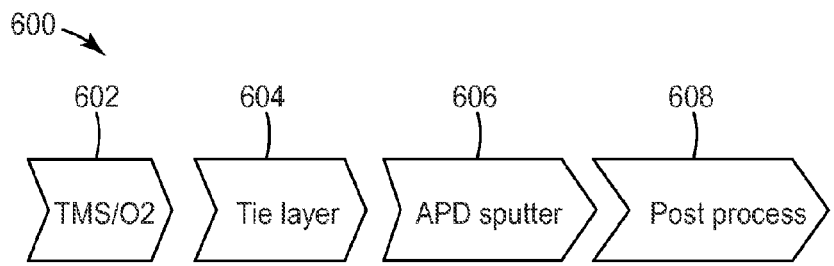
FIG. 6 shows a flow chart illustrating a method of manufacturing a reflection sheet according to another embodiment that utilises a tetramethylsilane/O$_2$ (TMS/O$_2$) plasma treatment.

FIG. 6 shows a flow chart 600 illustrating a method of manufacturing a reflection sheet according to another example embodiment. Here, the material for the substrate layer is PET, which is initially coated with an indium tin oxide (ITO) layer. PET is an optical-transparent substrate material that can be used in flexible optoelectronic devices and touch screen products. ITO is a highly optical-transparent semiconductor that exhibits a transmission from the visible to near-infrared wavelengths and has a low sheet resistance ($R_s \approx 150$ Ω/sq). ITO thin films deposited onto flexible transparent substrates can be used as transparent and conductive electrodes for a variety of technological applications such as flat panel displays, solar cells, smart windows, touch screens, etc.

At step 602, the ITO/PET substrate is subjected to a tetramethylsilane/$O_2$ (TMS/$O_2$) plasma treatment on ITO surface, such that the modified ITO surface contains TMS component after the treatment. At step 604, a tie layer which can be e.g. molybdenum silver (MoAg) or nickel chromium (NiCr), chromium oxide ($CrO_x$), nickel chromium oxide ($NiCrO_x$), titanium (Ti), titanium oxide, molybdenum, etc., is deposited onto the ITO surface e.g. by a sputtering process. At step 606, an APD reflective layer is deposited, e.g. by a sputtering process, on to the tie layer deposited in step 604. Similar to other embodiments, the ratio of the weight percent in APD is Ag:Pd:Nd=98.7:1:0.3. The thickness of the deposited APD in this embodiment may be about 100 nanometers (nm). At step 608, post processing is performed after completing APD deposition, to create patterns using the APD/Tie/ITO/PET structure and to obtain optical electronic devices.

The TMS/$O_2$ plasma treatment in the example embodiment can significantly enhance the adhesion between the ITO layer and the tie and APD layers. In other words, the peel strength of the reflection sheet formed by the method of the example embodiment can be improved. Such a reflection sheet may be suitable for use in display circuits e.g. for flexible touch screen products. For example, the patterned ITO layer can form electrodes of capacitors and the APD layer connects the patterned ITO layer to functional electric circuits, as the APD layer has a relatively low sheet resistance ($R_s \approx 0.3$ Ω/sq), and its minimum line width can be reduced to 30 μm.

Figure 7:
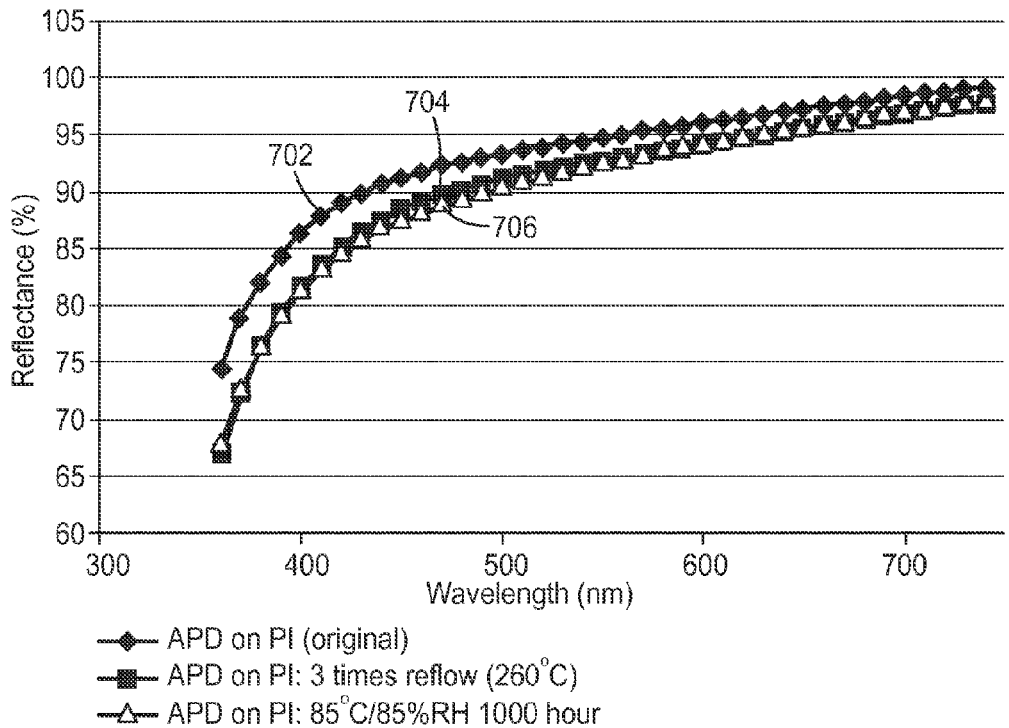
FIG. 7 shows graphs illustrating reflectance values of APD samples over various wavelengths.

The APD alloy as described in the above examples has been tested to confirm its suitable for lighting applications. FIG. 7 shows graphs illustrating reflectance values of APD samples over various wavelengths. As shown by line 702 of the graphs, APD on PI (original) has a very high reflectance (more than 94%) at the visible light region of the spectrum. It has also been noted that reflectivity only drops a little (from 94% to about 90%), as shown by line 704, even after exposing the samples for 1000 hours under 85° C. and 85% relative humidity. After 3 times of solder reflow test (at maximum temperature of 260° C.), the reflectivity may drop from 94% to about 91%, as shown by line 706. These properties make the reflective layer particularly suitable for reflective lighting applications.

Figure 8:
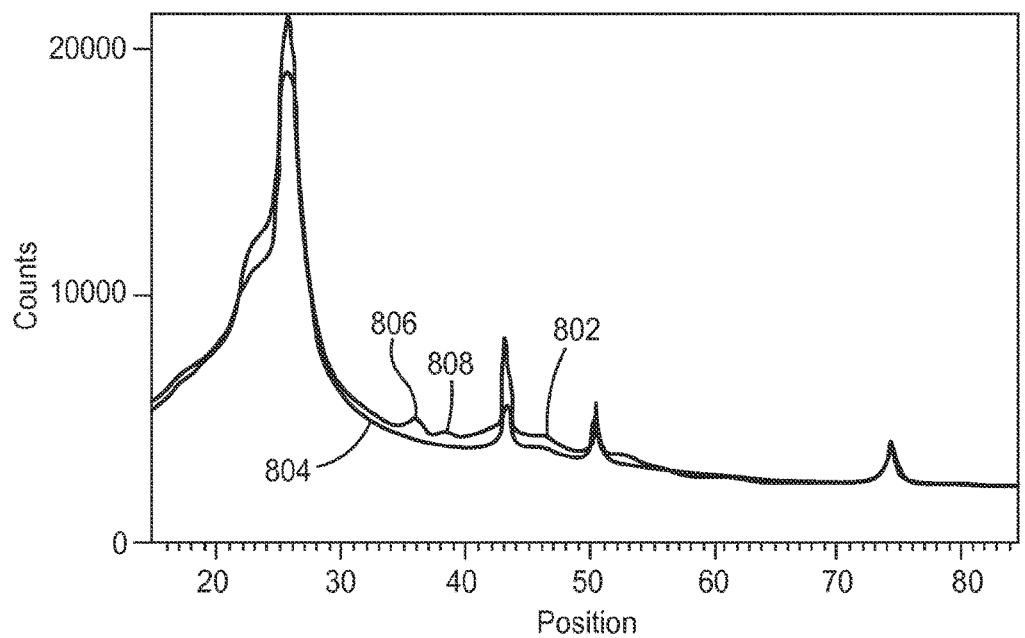
FIG. 8 shows graphs illustrating X-ray diffraction (XRD) results of a Cu film after 3 weeks of exposure against a reference Cu film.

Moreover, the ratio of the weight percent of silver/palladium/neodymium of 98.7:1:0.3 in the APD according to the example embodiments can provide a protective corrosion-resistant coating to the reflection sheet compared to a conventional copper coating, making the reflection sheet as discussed above suitable for light reflection applications. In a study to illustrate this property, small samples of 5 cm×5 cm in dimension of APD and Cu have been prepared and exposed to humidity conditions at 80° C. and 85% relative humidity. Sheet resistance is measured before and after humidity tests. As shown in Table 5, the change in sheet resistance increases with respect to number of days the samples are kept in the humidity chamber. After a month of exposure, the sheet resistance for copper increases by 47%, whereas the APD sheet resistance increases only by 16%. Formation of copper oxide in the Cu samples has also been confirmed by X-ray diffraction (XRD) analysis. FIG. 8 show graphs illustrating the XRD results of the Cu film after 3 weeks of exposure (curve 802) against the reference Cu film (curve 804). As shown in the XRD pattern, two peaks 806, 808 of approximate values of 36.46 and 38.58 at 2 theta corresponding to copper oxide appear after 3 weeks of exposure of copper to 85° C. and 85% relative humidity.

TABLE 5

| Number of days samples kept in Humidity chamber at 85 C./85% RH | APD % Change in sheet resistance after Humidity test | Copper % Change in sheet resistance after Humidity test |
|---|---|---|
| 7 days | 1.50 | 14.660 |
| 14 days | 2.01 | 23.310 |
| 21 days | 4.52 | 30.82 |
| 28 days | 16.58 | 47.36 |

In another test, two sets of samples of PET/ITO/Ag alloy (sample 1) and PET/ITO/Cu (sample 2) respectively have been immersed in 5% sodium chloride (NaCl) solution at different intervals of time. After taking the samples from NaCl, the samples are washed with de-ionised water and air dried to measure the corrosion levels based on visual appearance. As shown in Table 6, severe levels of corrosion are observed for sample 2 compared to sample 1.

TABLE 6

| | Corrosion level (1 low corrosion, 10 is sever corrosion) | |
|---|---|---|
| Immersion time (hr) | Sample 1 | Sample 2 |
| 2 | 1 | 1 |
| 3 | 1 | 1 |
| 7 | 1 | 5 |
| 17 | 1 | 7 |

Figure 9:
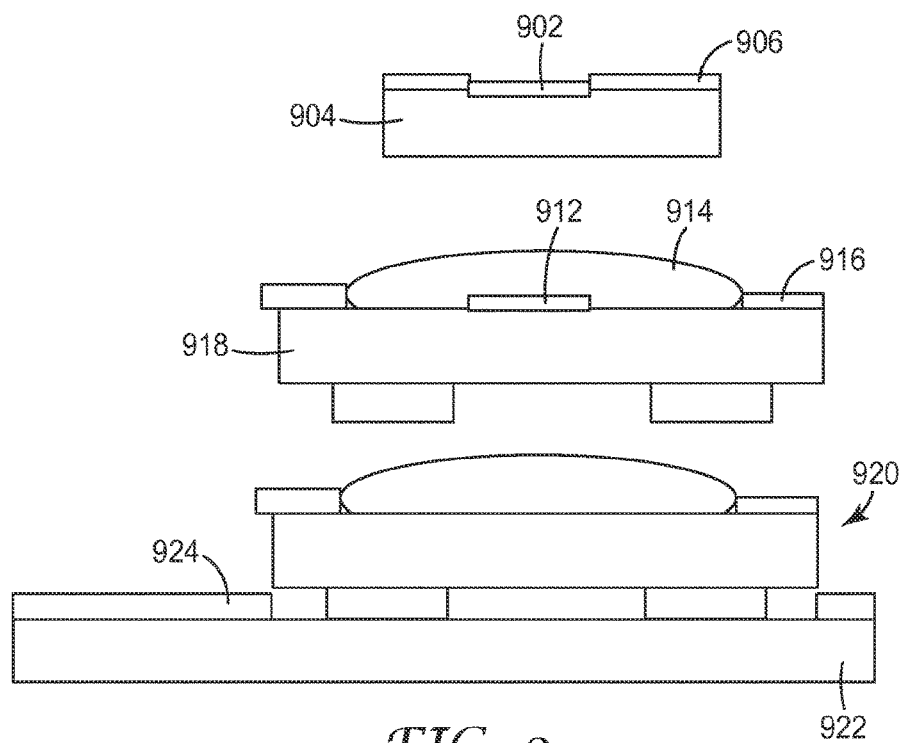
FIG. 9 shows schematic diagrams illustrating different LED packaging levels.
Figure 10:
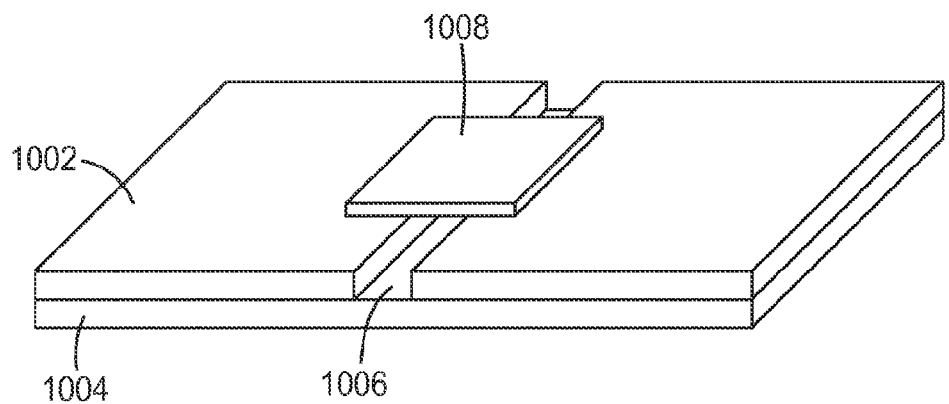
FIG. 10 shows a schematic diagram illustrating an example use of the reflection sheet with an LED.
Figure 11:
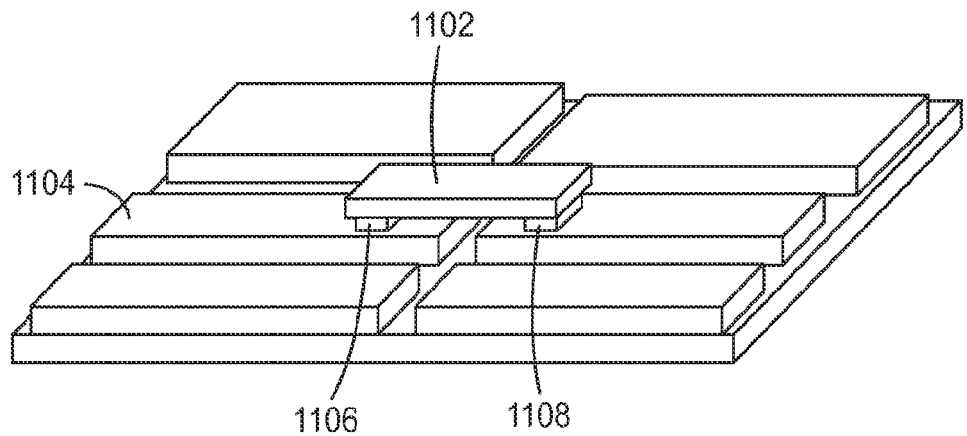
FIG. 11 shows a schematic diagram illustrating another example use of the reflection sheet with an LED.

FIGS. 9-11 shows schematic diagrams illustrating example applications of the APD alloy and/or the reflection sheet as described in the above example embodiments.

FIG. 9 shows schematic diagrams of example LED packaging using the reflection sheets as described. In level 1 LED packaging, the LED chip 902 is bonded to a flex packaging substrate 904, and the APD layer 906 is applied on the PI packaging substrate 904 for increasing reflection. In level 2 LED packaging, the LED die 912 is covered with an encapsulation layer 914, and the APD layer 916 is applied to the substrate 918 for increasing reflection. In level 3 LED packaging, the packaged LED 920, which may be obtained from level 2 packaging, is mounted on a dielectric layer 922 of a driving printed circuit board (PCB), which may be flexible or rigid. An additional APD layer 924 may also be used on the dielectric layer 922 of the PCB.

FIGS. 10-11 show examples of flex circuits where the APD is used as electrical traces of the respective flexible circuits, e.g. to package LED. In this construction, the reflective layer has two functions as both the reflector and the electrical connections. For example, with reference to FIG. 10, the APD reflective layer 1002 is applied to a substrate layer 1004, which may be polyimide or a similar base dielectric. The ADP reflective layer 1002 may be patterned such that the reflective material covers most of the substrate layer 1004, only allowing for gaps, e.g. 1006, to prevent shorting in the electrical pathway. An LED 1008 may be placed over the gap 1006.

Alternatively, flip chip or surface mounted testing (SMT) and wire-bond configurations are possible interconnection schemes that can be applied directly on the APD reflective layer. For example, FIG. 11 shows an LED 1102 interconnected to electrical traces formed by an APD layer 1104 via pads 1106, 1108.

Figure 12:
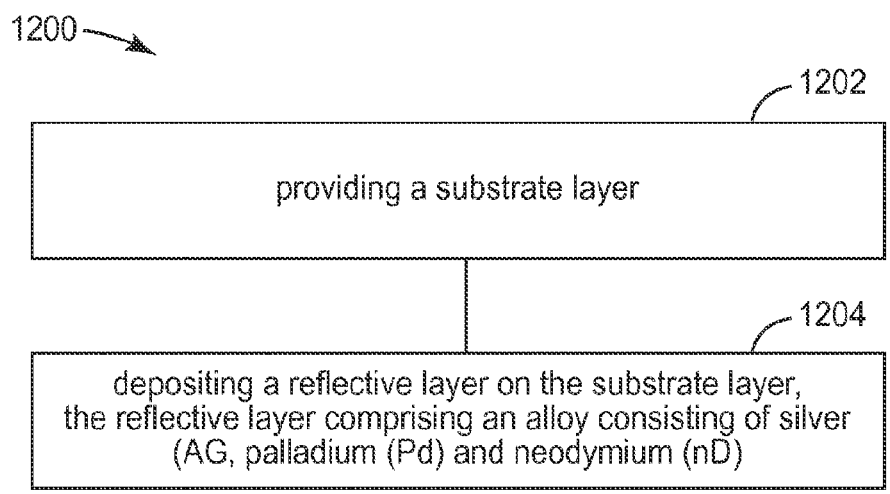
FIG. 12 shows a flow chart illustrating a method of manufacturing a reflection sheet according to an example embodiment.

FIG. 12 shows a flow chart 1200 illustrating a method of manufacturing a reflection sheet according to an example embodiment. At step 1202, a substrate layer is provided. At step 1204, a reflective layer is deposited on the substrate layer, the reflective layer comprising an alloy consisting of silver (Ag), palladium (Pd) and neodymium (Nd).

The following are a list of items of the present disclosure.

Item 1 is a reflection sheet comprising: a substrate layer; and a reflective layer formed on the substrate layer, wherein the reflective layer comprises an alloy consisting of silver (Ag), palladium (Pd) and neodymium (Nd).

Item 2 is the reflection sheet as claimed in item 1, wherein a weight percent of Ag in the alloy is in the range of 98-99%, the weight percent of Pd is in the range of 0.5-1.5%, and the weight percent of Nd is in the range of 0.1-1.0%, the sum of the weight percents making 100%.

Item 3 is the reflection sheet as claimed in item 2, wherein the ratio of the weight percent of Ag:Pd:Nd in the alloy is 98.7:1:0.3.

Item 4 is the reflection sheet as claimed in item 1, wherein the substrate layer comprises a material selected from a group consisting of polyimide, polyester (PET), epoxy, liquid crystal polymer (LCP) and thermoplastic polymer.

Item 5 is the reflection sheet as claimed in item 4, further comprising at least one intermediate layer disposed between the substrate layer and the reflective layer.

Item 6 is the reflection sheet as claimed in item 5, wherein the substrate layer comprises polyimide, and wherein the at least one intermediate layer comprises a copper (Cu) layer.

Item 7 is the reflection sheet as claimed in item 6, wherein the at least one intermediate layer further comprises a diffusion barrier layer between the copper layer and the reflective layer, the diffusion barrier layer comprising an alloy consisting of nickel (Ni), chromium (Cr) and titanium (Ti).

Item 8 is the reflection sheet as claimed in item 6, wherein the at least one intermediate layer further comprises a tie layer between the polyimide substrate layer and the copper layer, the tie layer comprising at least one material selected from a group consisting of nickel-chromium (NiCr), chromium oxide ($CrO_x$), silver (Ag) and molybdenum silver (MoAg).

Item 9 is the reflection sheet as claimed in item 5, wherein the substrate layer comprises PET, and wherein the at least one intermediate layer comprises a tie layer comprising at least one material selected from a group consisting of copper (Cu), molybdenum (Mo), silver (Ag), molybdenum silver (MoAg), nickel chromium (NiCr), chromium oxide ($CrO_x$), nickel chromium oxide ($NiCrO_x$), titanium (Ti) and titanium oxide (TiO).

Item 10 is the reflection sheet as claimed in item 9, wherein the at least one intermediate layer further comprises an indium-tin-oxide (ITO) layer between the PET substrate layer and the tie layer.

Item 11 is the reflection sheet as claimed in item 10, wherein the ITO layer comprises a surface treated with a tetramethylsilane/$O_2$ (TMS/$O_2$) plasma for enhancing adhesion.

Item 12 is a method of manufacturing a reflection sheet, the method comprising the steps of: providing a substrate layer; and depositing a reflective layer on the substrate layer, wherein the reflective layer comprises an alloy consisting of silver (Ag), palladium (Pd) and neodymium (Nd).

Item 13 is the method as claimed in item 12, wherein a weight percent of Ag in the alloy is in the range of 98-99%, the weight percent of Pd is in the range of 0.5-1.5%, and the weight percent of Nd is in the range of 0.1-1.0%, the sum of the weight percents making 100%.

Item 14 is the method as claimed in item 13, wherein the ratio of the weight percent of Ag:Pd:Nd in the alloy is 98.7:1:0.3.

Item 15 is the method as claimed in item 12, wherein the substrate layer comprises a material selected from a group consisting of polyimide, polyester (PET), epoxy, liquid crystal polymer (LCP) and thermoplastic polymer.

Item 16 is the method as claimed in item 15, further comprising depositing at least one intermediate layer on the substrate layer prior to depositing the reflective layer.

Item 17 is the method as claimed in item 16, wherein the substrate layer comprises polyimide, and wherein depositing at least one intermediate layer comprises depositing a copper (Cu) layer on the substrate layer using electric deposition technique.

Item 18 is the method as claimed in item 17, wherein depositing at least one intermediate layer further comprises depositing a diffusion barrier layer on the copper layer prior to depositing the reflective layer, the diffusion barrier layer comprising an alloy consisting of nickel (Ni), chromium (Cr) and titanium (Ti).

Item 19 is the method as claimed in item 17, wherein depositing at least one intermediate layer further comprises depositing a tie layer on the polyimide substrate layer prior to depositing the copper layer, the tie layer comprising at least one material selected from a group consisting of nickel-chromium (NiCr), chromium oxide ($CrO_x$), silver (Ag) and molybdenum silver (MoAg).

Item 20 is the method as claimed in item 16, wherein the substrate layer comprises PET, and wherein depositing at least one intermediate layer comprises depositing a tie layer comprising at least one material selected from a group consisting of copper (Cu), molybdenum (Mo), silver (Ag), molybdenum silver (MoAg), nickel chromium (NiCr), chromium oxide ($CrO_x$), nickel chromium oxide ($NiCrO_x$), titanium (Ti) and titanium oxide (TiO).

Item 21 is the method as claimed in item 20, wherein depositing at least one intermediate layer further comprises depositing an indium-tin-oxide (ITO) layer on the PET substrate layer prior to depositing the tie layer.

Item 22 is the method as claimed in item 21, further comprising treating a surface of the ITO layer with a tetramethylsilane/$O_2$ (TMS/$O_2$) plasma for enhancing adhesion.

Item 23 is a flexible circuit comprising the reflection sheet as claimed in item 1.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A reflection sheet comprising:
    a substrate layer;
    a reflective layer formed on the substrate layer,
        wherein the reflective layer comprises an alloy consisting of silver (Ag), palladium (Pd) and neodymium (Nd); and
    an intermediate indium-tin-oxide (ITO) layer disposed between the substrate layer and the reflective layer and comprising a surface treated with a tetramethylsilane/$O_2$ (TMS/$O_2$) plasma.

2. The reflection sheet as claimed in claim 1, wherein a weight percent of Ag in the alloy is in the range of 98-99%, the weight percent of Pd is in the range of 0.5-1.5%, and the weight percent of Nd is in the range of 0.1-1.0%, the sum of the weight percents making 100%.

3. The reflection sheet as claimed in claim 2, wherein the ratio of the weight percent of Ag:Pd:Nd in the alloy is 98.7:1:0.3.

4. The reflection sheet as claimed in claim 1, wherein the substrate layer comprises a material selected from a group consisting of polyimide, polyester (PET), epoxy, liquid crystal polymer (LCP) and thermoplastic polymer.

5. The reflection sheet as claimed in claim 4, further comprising at least one other intermediate layer disposed between the substrate layer and the reflective layer.

6. The reflection sheet as claimed in claim 5, wherein the substrate layer comprises polyimide, and wherein the at least one other intermediate layer comprises a copper (Cu) layer.

7. The reflection sheet as claimed in claim 6, wherein the at least one other intermediate layer further comprises a diffusion barrier layer between the copper layer and the reflective layer, the diffusion barrier layer comprising an alloy consisting of nickel (Ni), chromium (Cr) and titanium (Ti).

8. The reflection sheet as claimed in claim 6, wherein the at least one other intermediate layer further comprises a tie layer between the polyimide substrate layer and the copper layer, the tie layer comprising at least one material selected from a group consisting of nickel-chromium (NiCr), chromium oxide ($CrO_x$), silver (Ag) and molybdenum silver (MoAg).

9. The reflection sheet as claimed in claim 5, wherein the substrate layer comprises PET, and wherein the at least one other intermediate layer comprises a tie layer comprising at least one material selected from a group consisting of copper (Cu), molybdenum (Mo), silver (Ag), molybdenum silver (MoAg), nickel chromium (NiCr), chromium oxide ($CrO_x$), nickel chromium oxide ($NiCrO_x$), titanium (Ti) and titanium oxide (TiO).

10. A flexible circuit comprising the reflection sheet as claimed in claim 1.

11. A method of manufacturing a reflection sheet, the method comprising the steps of:
    providing a substrate layer;
    depositing a reflective layer on the substrate layer, wherein the reflective layer comprises an alloy consisting of silver (Ag), palladium (Pd) and neodymium (Nd); and
    depositing an intermediate indium-tin-oxide (ITO) layer between the substrate layer and the reflective layer, the ITO layer comprising a surface treated with a tetramethylsilane/$O_2$ (TMS/$O_2$) plasma.

12. The method as claimed in claim 11, wherein a weight percent of Ag in the alloy is in the range of 98-99%, the weight percent of Pd is in the range of 0.5-1.5%, and the weight percent of Nd is in the range of 0.1-1.0%, the sum of the weight percents making 100%.

13. The method as claimed in claim 12, wherein the ratio of the weight percent of Ag:Pd:Nd in the alloy is 98.7:1:0.3.

14. The method as claimed in claim 11, wherein the substrate layer comprises a material selected from a group consisting of polyimide, polyester (PET), epoxy, liquid crystal polymer (LCP) and thermoplastic polymer.

15. The method as claimed in claim 14, further comprising depositing at least one other intermediate layer on the substrate layer prior to depositing the reflective layer.

16. The method as claimed in claim 15, wherein the substrate layer comprises polyimide, and wherein depositing the at least one other intermediate layer comprises depositing a copper (Cu) layer on the substrate layer using electric deposition technique.

17. The method as claimed in claim 16, wherein depositing the at least one other intermediate layer further comprises depositing a diffusion barrier layer on the copper layer prior to depositing the reflective layer, the diffusion barrier layer comprising an alloy consisting of nickel (Ni), chromium (Cr) and titanium (Ti).

18. The method as claimed in claim 16, wherein depositing the at least one other intermediate layer further comprises depositing a tie layer on the polyimide substrate layer prior to depositing the copper layer, the tie layer comprising at least one material selected from a group consisting of nickel-chromium (NiCr), chromium oxide ($CrO_x$), silver (Ag) and molybdenum silver (MoAg).

19. The method as claimed in claim 15, wherein the substrate layer comprises PET, and wherein depositing the at least one other intermediate layer comprises depositing a tie layer comprising at least one material selected from a group consisting of copper (Cu), molybdenum (Mo), silver (Ag), molybdenum silver (MoAg), nickel chromium (NiCr), chromium oxide ($CrO_x$), nickel chromium oxide ($NiCrO_x$), titanium (Ti) and titanium oxide (TiO).

* * * * *